(12) United States Patent  
Ji et al.

(10) Patent No.: US 10,600,926 B2  
(45) Date of Patent: Mar. 24, 2020

(54) SOLAR CELL AND METHOD OF MANUFACTURING THE SAME

(71) Applicant: LG ELECTRONICS INC., Seoul (KR)

(72) Inventors: Kwangsun Ji, Seoul (KR); Sehwon Ahn, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/393,591

(22) Filed: Apr. 24, 2019

(65) Prior Publication Data

US 2019/0252562 A1 Aug. 15, 2019

Related U.S. Application Data

(62) Division of application No. 15/416,673, filed on Jan. 26, 2017, now Pat. No. 10,312,386.

(30) Foreign Application Priority Data

Jan. 28, 2016 (KR) .................. 10-2016-0010497

(51) Int. Cl.
*H01L 31/0224* (2006.01)
*H01L 31/18* (2006.01)
(Continued)

(52) U.S. Cl.
CPC ............... *H01L 31/022441* (2013.01); *H01L 31/02008* (2013.01); *H01L 31/022433* (2013.01);
(Continued)

(58) Field of Classification Search
CPC ....... H01L 31/022441; H01L 31/02008; H01L 31/022433; H01L 31/035281; H01L 31/0682; H01L 31/18
See application file for complete search history.

(56) References Cited

U.S. PATENT DOCUMENTS 8,017,861 B2 * 9/2011 Basol ............... C25D 3/56
136/252
2009/0078316 A1 3/2009 Khazeni et al.
(Continued)

FOREIGN PATENT DOCUMENTS

JP 2009-117741 A 5/2009
KR 10-2010-0096819 A 9/2010
(Continued)

*Primary Examiner* — Jayne L Mershon
(74) *Attorney, Agent, or Firm* — Birch, Stewart, Kolasch & Birch, LLP

(57) ABSTRACT

A solar cell includes a semiconductor substrate, a first semiconductor region positioned at a front surface or a back surface of the semiconductor substrate and doped with impurities of a first conductive type, a first electrode on the first semiconductor region, a second electrode on the back surface of the semiconductor substrate, and a second semiconductor region positioned between the semiconductor substrate and the second electrode and doped with impurities of a second conductive type opposite the first conductive type, wherein the second electrode is formed of a metal foil, and an air gap is formed between the second electrode formed of the metal foil and the back surface of the semiconductor substrate.

8 Claims, 14 Drawing Sheets

(51) Int. Cl.
*H01L 31/02* (2006.01)
*H01L 31/0352* (2006.01)
*H01L 31/068* (2012.01)

(52) U.S. Cl.
CPC .. *H01L 31/035281* (2013.01); *H01L 31/0682* (2013.01); *H01L 31/18* (2013.01); *Y02E 10/52* (2013.01); *Y02E 10/547* (2013.01)

(56) References Cited

U.S. PATENT DOCUMENTS

| | | | | |
|---|---|---|---|---|
| 2012/0305063 | A1* | 12/2012 | Moslehi | H01L 31/035281 136/256 |
| 2014/0174519 | A1 | 6/2014 | Rim et al. | |
| 2014/0224307 | A1* | 8/2014 | Chen | H01L 31/077 136/255 |
| 2015/0129031 | A1* | 5/2015 | Moslehi | H01L 31/022441 136/256 |
| 2015/0280021 | A1* | 10/2015 | Harley | H01L 31/022441 136/255 |
| 2015/0280029 | A1* | 10/2015 | Harley | H01L 31/022441 136/249 |
| 2015/0280042 | A1* | 10/2015 | Wanlass | H01L 31/184 136/255 |
| 2016/0329862 | A1* | 11/2016 | Yoshikawa | H01L 31/05 |

FOREIGN PATENT DOCUMENTS

| | | |
|---|---|---|
| KR | 10-2012-0094787 A | 8/2012 |
| KR | 10-2014-0015247 A | 2/2014 |
| KR | 10-2014-0115435 A | 10/2014 |
| KR | 10-2014-0143277 A | 12/2014 |
| WO | WO2015/098872 A1 | 7/2015 |
| WO | WO2015/183761 A1 | 12/2015 |
| WO | WO2016/100239 A1 | 6/2016 |

\* cited by examiner

SOLAR CELL AND METHOD OF MANUFACTURING THE SAME

CROSS-REFERENCE TO RELATED APPLICATION

This application is a Divisional Application of U.S. application Ser. No. 15/416,673 filed Jan. 26, 2017, which claims priority to, and the benefit of, Korean Patent Application No. 10-2016-0010497 filed in the Republic of Korea on Jan. 28, 2016. All of these applications are incorporated herein by reference for all purposes as if fully set forth herein.

BACKGROUND OF THE INVENTION

Field of the Invention

Embodiments of the invention relate to a solar cell and a method of manufacturing the same.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, a plurality of electron-hole pairs are produced in the semiconductor parts and are separated into electrons and holes by the incident light. The electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

SUMMARY OF THE INVENTION

Embodiments of the invention provide a solar cell and a method of manufacturing the same.

In one aspect, there is provided a solar cell including a semiconductor substrate, a first semiconductor region positioned at a front surface or a back surface of the semiconductor substrate and doped with impurities of a first conductive type, a first electrode connected to the first semiconductor region, and a second electrode connected to the back surface of the semiconductor substrate, wherein the second electrode is formed of a metal foil, and an air gap is formed between the second electrode formed of the metal foil and the back surface of the semiconductor substrate.

The second electrode formed of the metal foil may include a contact portion contacting the back surface of the semiconductor substrate, and a non-contact portion that is spaced apart from the back surface of the semiconductor substrate to form the air gap between the second electrode and the back surface of the semiconductor substrate.

In this instance, the contact portion of the second electrode formed of the metal foil may be in point contact or line contact with the back surface of the semiconductor substrate.

The second electrode formed of the metal foil may be made of at least one of Ag, Al, Au, W, Mo, Ni, Pt, Cu, Ti, Cr, and Fe, or an alloy thereof.

A thickness of the non-contact portion of the second electrode formed of the metal foil may be 20 µm to 30 µm. Further, the contact portion of the second electrode formed of the metal foil may be further recessed toward the semiconductor substrate than the non-contact portion.

The solar cell may further include a second semiconductor region positioned between the semiconductor substrate and the second electrode formed of the metal foil and doped with impurities of a second conductive type opposite the first conductive type. The contact portion of the second electrode formed of the metal foil may contact the second semiconductor region, and the non-contact portion of the second electrode formed of the metal foil may be spaced apart from the second semiconductor region to form the air gap.

An impurity doping concentration of a portion of the second semiconductor region contacting the contact portion may be higher than an impurity doping concentration of a portion of the second semiconductor region not contacting the contact portion.

The solar cell may further include a metal electrode layer positioned between the second semiconductor region and the second electrode formed of the metal foil and entirely connected to the semiconductor substrate. The contact portion may contact the metal electrode layer, and the non-contact portion may be spaced apart from the metal electrode layer to form the air gap.

The solar cell may further include a back passivation layer positioned between the second semiconductor region and the second electrode formed of the metal foil, and formed of a dielectric material. The contact portion may pass through the back passivation layer and contact the second semiconductor region. The non-contact portion may be spaced apart from the back passivation layer to form the air gap. In this instance, a conductive contact electrode passing through the back passivation layer may be further positioned between the contact portion and the second semiconductor region.

The semiconductor substrate may be formed of a crystalline silicon material, and the second semiconductor region may be formed of an amorphous silicon material. A transparent electrode layer may be positioned at a back surface of the second semiconductor region formed of the amorphous silicon material. The contact portion may contact the transparent electrode layer, and the non-contact portion may be spaced apart from the transparent electrode layer to form the air gap.

A conductive contact electrode may be further positioned between the contact portion and the transparent electrode layer.

In another aspect, there is provided a solar cell including a semiconductor substrate, a first semiconductor region positioned at a back surface of the semiconductor substrate and doped with impurities of a first conductive type, a second semiconductor region positioned at the back surface of the semiconductor substrate and doped with impurities of a second conductive type opposite the first conductive type, a first electrode connected to the first semiconductor region, and a second electrode connected to the second semiconductor region, wherein each of the first electrode and the second electrode is formed of a metal foil covering the first semiconductor region and the second semiconductor region, respectively, and an air gap is formed between the first and second electrodes formed of the metal foil and the first and second semiconductor regions.

The first electrode formed of the metal foil may include a first contact portion contacting a back surface of the first semiconductor region and a first non-contact portion that is spaced apart from the first semiconductor region to form the air gap between the first electrode and the first semiconductor region. The second electrode formed of the metal foil may include a second contact portion contacting a back surface of the second semiconductor region and a second non-contact portion that is spaced apart from the second semiconductor region to form the air gap between the second electrode and the second semiconductor region.

The first contact portion may be in point contact or line contact with the back surface of the first semiconductor region, and the second contact portion may be in point contact or line contact with the back surface of the second semiconductor region.

The first and second electrodes formed of the metal foil may be made of at least one of Ag, Al, Au, W, Mo, Ni, Pt, Cu, Ti, Cr, and Fe, or an alloy thereof.

A thickness of each of the first and second contact portions may be 20 μm to 30 μm. Further, the first and second contact portions may be further recessed toward the semiconductor substrate than the first and second non-contact portions, respectively.

In yet another aspect, there is provided a method of manufacturing a solar cell including preparing a semiconductor substrate including a first semiconductor region doped with impurities of a first conductive type at a front surface or a back surface of the semiconductor substrate; forming a first electrode connected to the first semiconductor region; and a second electrode forming operation including forming a second electrode connected to the back surface of the semiconductor substrate using a metal foil and at the same time forming an air gap between the metal foil and the back surface of the semiconductor substrate.

The second electrode formed of the metal foil in the second electrode forming operation may include a contact portion contacting the back surface of the semiconductor substrate, and a non-contact portion that is spaced apart from the back surface of the semiconductor substrate to form the air gap between the metal foil and the back surface of the semiconductor substrate.

The semiconductor substrate may further include a second semiconductor region positioned at the back surface of the semiconductor substrate and doped with impurities of a second conductive type opposite the first conductive type. The second electrode forming operation may include forming the second electrode connected to the second semiconductor region using the metal foil and at the same time forming the air gap between the metal foil and the second semiconductor region.

The contact portion of the second electrode formed of the metal foil may contact the second semiconductor region formed at the back surface of the semiconductor substrate. The non-contact portion of the second electrode formed of the metal foil may be spaced apart from the second semiconductor region to form the air gap.

The second electrode forming operation may further include performing a thermal process on the contact portion of an entire portion of the metal foil to bring the contact portion into contact with the second semiconductor region.

The thermal process of the second electrode forming operation may be performed using at least one of laser irradiation, infrared irradiation, hot air, or hot probe.

The thermal process of the second electrode forming operation may be performed using laser irradiation, and an intensity of a laser may be in a range between 6 mJ/cm$^2$ and 500 mJ/cm$^2$.

The first semiconductor region may be extended in a first direction at the back surface of the semiconductor substrate. The second semiconductor region may be spaced apart from the first semiconductor region at the back surface of the semiconductor substrate and extended in the first direction. The forming of the first electrode may include forming the first electrode connected to the first semiconductor region using the metal foil and at the same time forming an air gap between the metal foil and the first semiconductor region.

The first electrode formed of the metal foil may include a first contact portion contacting a back surface of the first semiconductor region and a first non-contact portion that is spaced apart from the first semiconductor region to form the air gap between the metal foil and the first semiconductor region. The second electrode formed of the metal foil may include a second contact portion contacting a back surface of the second semiconductor region and a second non-contact portion that is spaced apart from the second semiconductor region to form the air gap between the metal foil and the second semiconductor region.

A solar cell and a method of manufacturing the same according to embodiments of the invention can further improve a back reflectance of a semiconductor substrate by forming electrodes using a metal foil and forming an air gap between the metal foil and the semiconductor substrate, and can also reduce the manufacturing cost of the solar cell by simplifying a method of forming the electrodes.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
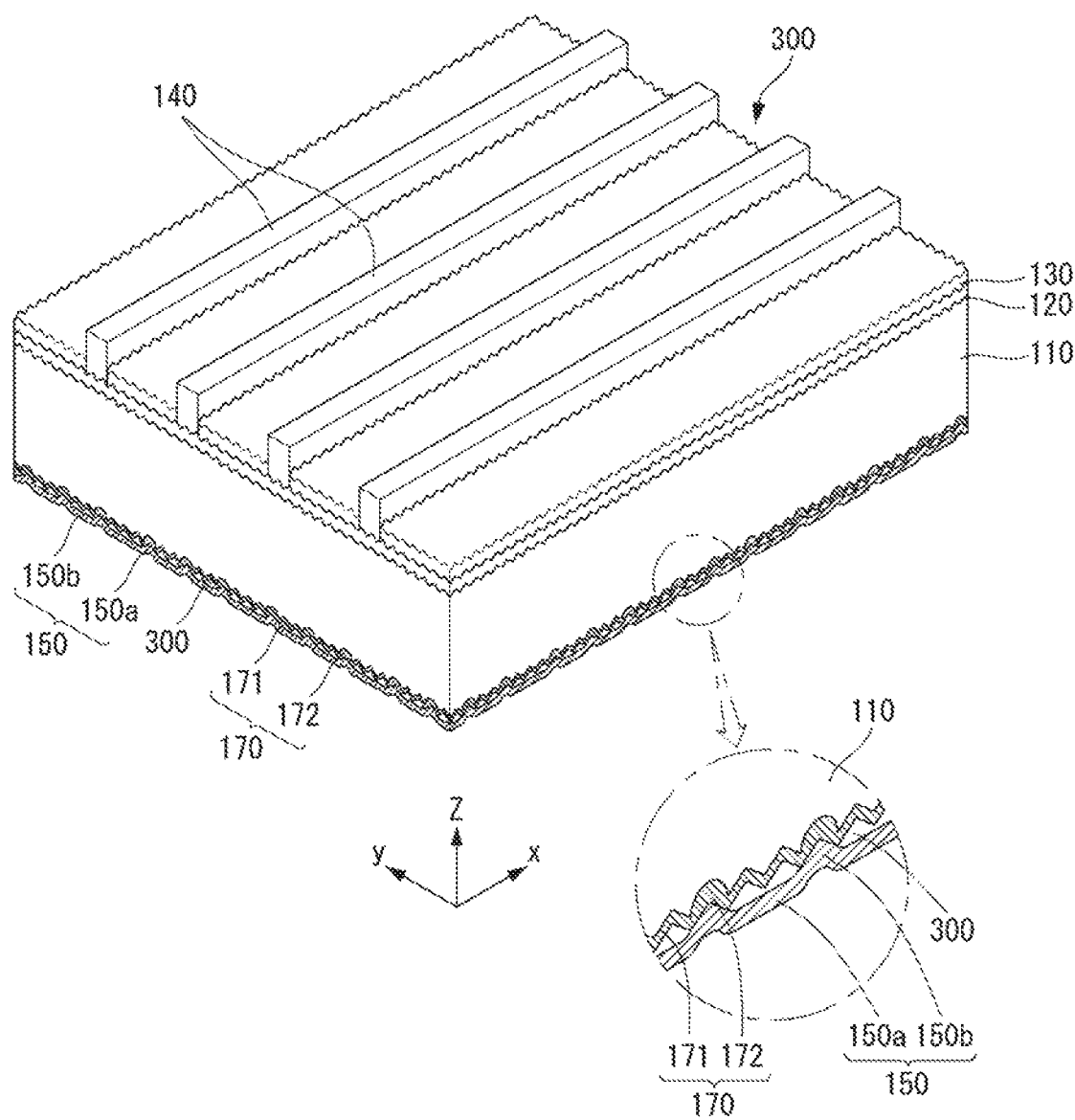
FIG. 1 is a partial perspective view of a solar cell according to a first embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

In the following description, "front surface" may be one surface of a semiconductor substrate, on which light is directly incident, and "back surface" may be a surface opposite the one surface of the semiconductor substrate, on which light is not directly incident or reflective light may be incident.

In the following description, the fact that values (for example, lengths or widths) of two different components are substantially equal to each other means that the values are equal to each other within a margin of error of 10% or less.

Embodiments of the invention will be described below with reference to FIGS. 1 to 12.

Figure 2:
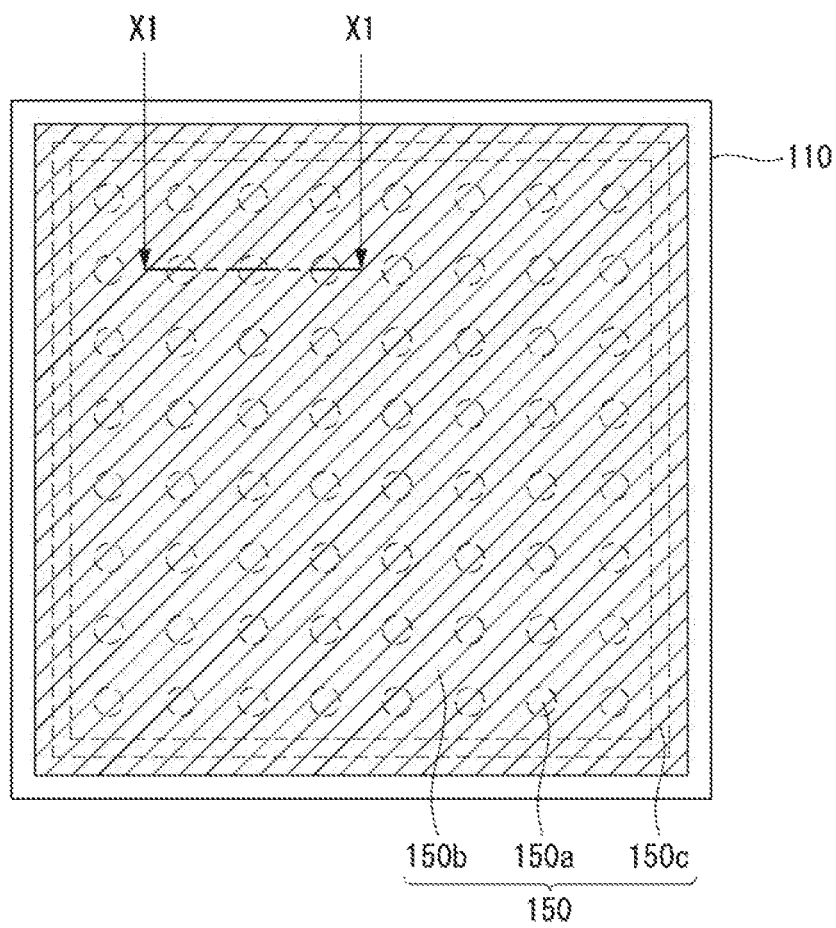
FIG. 2 illustrates a back pattern of a solar cell according to a first embodiment of the invention.
Figure 3:
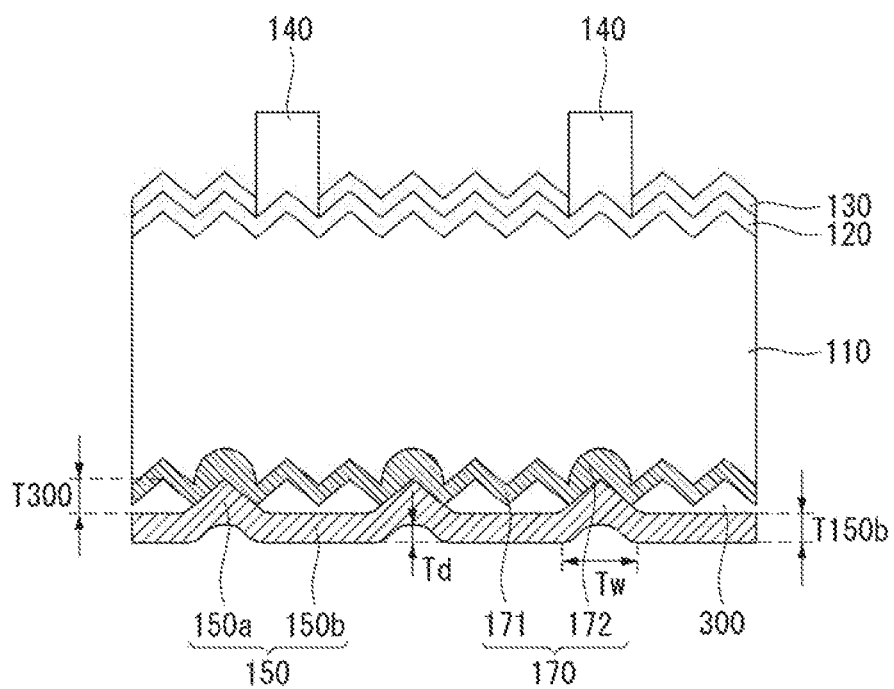
FIG. 3 is a cross-sectional view of a solar cell according to a first embodiment of the invention.

FIG. 1 is a partial perspective view of a solar cell according to a first embodiment of the invention. FIG. 2 illustrates a back pattern of the solar cell according to the first embodiment of the invention. FIG. 3 is a cross-sectional view of the solar cell according to the first embodiment of the invention.

As shown in FIG. 1, a solar cell according to a first embodiment of the invention may include a semiconductor substrate 110, a first semiconductor region 120, an antireflection layer 130, a plurality of first electrodes 140, a second semiconductor region 170, and a second electrode 150.

In embodiments disclosed herein, the anti-reflection layer 130 and the second semiconductor region 170 may be omitted, if desired or necessary. However, when the solar cell includes them, efficiency of the solar cell may be further improved. Thus, embodiments of the invention are described using the solar cell including the anti-reflection layer 130 and the second semiconductor region 170 as an example.

The semiconductor substrate 110 may be formed of a crystalline silicon material of at least one of single crystal silicon and polycrystalline silicon doped with impurities of a first conductive type or a second conductive type. For example, the semiconductor substrate 110 may be formed of a single crystal silicon wafer.

In embodiments disclosed herein, the first conductive type or the second conductive type of the semiconductor substrate 110 may be one of an n-type and a p-type.

When the semiconductor substrate 110 is of the p-type, the semiconductor substrate 110 may be doped with impurities of a group III element, such as boron (B), gallium (Ga), and indium (In). Alternatively, when the semiconductor substrate 110 is of the n-type, the semiconductor substrate 110 may be doped with impurities of a group V element, such as phosphorus (P), arsenic (As), and antimony (Sb).

In the following description, embodiments of the invention are described using an example where impurities contained in the semiconductor substrate 110 are impurities of the second conductive type and are n-type impurities. However, embodiments of the invention are not limited thereto.

A front surface of the semiconductor substrate 110 may be an uneven surface having a plurality of uneven portions or having uneven characteristics. Thus, the first semiconductor regions 121 positioned on the front surface of the semiconductor substrate 110 may have an uneven surface.

Hence, an amount of light reflected from the front surface of the semiconductor substrate 110 may decrease, and an amount of light incident on the inside of the semiconductor substrate 110 may increase.

As shown in FIG. 1, the first semiconductor region 120 may be entirely formed at an incident surface (i.e., the front surface) of the semiconductor substrate 110. More specifically, the first semiconductor region 120 may be formed by doping the front surface of the semiconductor substrate 110 formed of the crystalline silicon material with impurities of the first conductive type.

When impurities of the second conductive type contained in the semiconductor substrate 110 are of the n-type, doped impurities of the first conductive type used to form the first semiconductor region 120 may be of the p-type. Hence, the semiconductor substrate 110 and the first semiconductor region 120 may form a p-n junction.

Light incident on the semiconductor substrate 110 may be separated into electrons and holes. The electrons may move to an n-type semiconductor part, and the holes may move to a p-type semiconductor part. Thus, the separated electrons may move to a back surface of the semiconductor substrate 110, and the separated holes may move to the first semiconductor region 120.

As described above, when the semiconductor substrate 110 is doped with impurities of the second conductive type, and the first semiconductor region 120 is doped with impurities of the first conductive type opposite the second conductive type of the semiconductor substrate 110, the first semiconductor region 120 may serve as an emitter region.

The anti-reflection layer 130 may be positioned at the incident surface of the semiconductor substrate 110 and may be positioned on the first semiconductor region 120.

The anti-reflection layer 130 may be formed as a plurality of layers including at least one of aluminum oxide (AlOx), hydrogenated silicon nitride (SiNx:H), hydrogenated silicon oxide (SiOx:H), hydrogenated silicon oxynitride (SiNxOy:H), and hydrogenated amorphous silicon (a-Si:H).

The anti-reflection layer 130 thus formed may further strengthen a passivation function and thus may further improve photoelectric efficiency of the solar cell.

As shown in FIG. 1, the plurality of first electrodes 140 may be positioned to be spaced apart from one another on the front surface of the semiconductor substrate 110. Each first electrode 140 may extend in a first direction x.

The plurality of first electrodes 140 may pass through the anti-reflection layer 130 and may be electrically connected to the first semiconductor region 120.

Hence, the plurality of first electrodes 140 may collect carriers moving to the first semiconductor region 120.

The second semiconductor region 170 may be positioned at the back surface opposite the incident surface of the semiconductor substrate 110. More specifically, the second semiconductor region 170 may be formed by doping the back surface of the semiconductor substrate 110 formed of the crystalline silicon material with impurities of the second conductive type.

When the semiconductor substrate 110 is doped with impurities of the second conductive type as described above, a doping concentration of impurities of the second conductive type used to form the second semiconductor region 170 may be higher than a doping concentration of impurities of the second conductive type contained in the semiconductor substrate 110. In this instance, the second semiconductor region 170 may serve as a back surface field region.

Further, the second semiconductor region 170 serving as the back surface field region may be entirely formed at the back surface of the semiconductor substrate 110. An impurity doping concentration of a portion of the second semiconductor region 170 connected to the second electrode 150 may be higher than an impurity doping concentration of a portion of the second semiconductor region 170 that is not connected to the second electrode 150.

For example, when an impurity doping concentration of the second conductive type of a portion 171 of the second semiconductor region 170, that is not connected to the second electrode 150, is $n^+$, an impurity doping concentration of the second conductive type of a portion 172 of the second semiconductor region 170 connected to the second electrode 150 may be $n^{++}$.

A potential barrier is formed by a difference in an impurity doping concentration between the semiconductor substrate 110 and the second semiconductor region 170. Hence, the potential barrier can prevent or reduce holes from moving to the second semiconductor region 170 used as a moving path of electrons and can make it easier for electrons to move to the second semiconductor region 170.

As a result, the embodiment of the invention can reduce an amount of carriers lost by a recombination and/or a disappearance of electrons and holes at and around the back surface of the semiconductor substrate 110 and can accelerates a movement of desired carriers toward the second electrode 150, thereby increasing an amount of carriers moving to the second electrode 150.

The second electrode 150 may be electrically connected to the back surface of the semiconductor substrate 110 and may collect carriers moving to the second semiconductor region 170.

The second electrode 150 may contact the second semiconductor region 170 having the impurity doping concentration higher than the semiconductor substrate 110, and thus transfer efficiency of carriers from the semiconductor substrate 110 to the second electrode 150 may be improved.

Wires may be connected to the first and second electrodes 140 and 150 of the solar cell according to the embodiment of the invention, and a plurality of solar cells may be electrically connected to one another or to an external circuit device through the wires. Hence, electric power generated in the solar cells may be used.

So far, the first embodiment of the invention described that the semiconductor substrate 110 is doped with second conductive type impurities (for example, n-type impurities), the first semiconductor region 120 is doped with first conductive type impurities (for example, p-type impurities) and serves as the emitter region, and the second semiconductor region 170 is doped with second conductive type impurities (for example, n-type impurities) and serves as the back surface field region, by way of example.

However, unlike the first embodiment of the invention, second conductive type impurities may be p-type impurities, and first conductive type impurities may be n-type impurities.

Further, unlike the first embodiment of the invention, the semiconductor substrate 110 and the first semiconductor region 120 may be doped with first conductive type impurities, and the second semiconductor region 170 may be doped with second conductive type impurities. In this instance, the first semiconductor region 120 positioned at the front surface of the semiconductor substrate 110 may serve as a front surface field region, and the second semiconductor region 170 positioned at the back surface of the semiconductor substrate 110 may serve as an emitter region.

In this instance, the second semiconductor region 170 positioned at the back surface of the semiconductor substrate 110 and the semiconductor substrate 110 may form a p-n junction.

In the solar cell according to the embodiment of the invention, the second electrode 150 may be formed of a metal foil. As shown in FIGS. 1 and 3, an air gap 300 may be formed between the second electrode 150 formed of the metal foil and the back surface of the semiconductor substrate 110.

More specifically, the second electrode 150 according to the embodiment of the invention may be formed of a thin metal foil. As shown in FIG. 2, the second electrode 150 formed of the thin metal foil may cover the entire back surface of the semiconductor substrate 110 except an edge of the semiconductor substrate 110.

As shown in FIGS. 1 and 3, a portion 150a of the second electrode 150 formed of the metal foil may be connected to the back surface of the semiconductor substrate 110, and a portion 150b of the second electrode 150 may be spaced apart from the back surface of the semiconductor substrate 110. Thus, the air gap 300 may be formed between the second electrode 150 formed of the metal foil and the back surface of the semiconductor substrate 110.

In embodiments disclosed herein, the air gap 300 indicates a space that is between the second electrode 150 formed of the metal foil and the back surface of the semiconductor substrate 110 and is filled with air.

As described above, the embodiment of the invention may form the second electrode 150 using the metal foil and may form the air gap 300 between the second electrode 150 formed of the metal foil and the back surface of the semiconductor substrate 110, thereby causing light of a long wavelength band passing through the semiconductor substrate 110 to be again incident toward the semiconductor substrate 110. Hence, efficiency of the solar cell according to the embodiment of the invention can be further improved.

For example, a back reflective layer having a refractive index less than the semiconductor substrate 110 including a silicon material having a refractive index of about 3.4 may be positioned on the back surface of the semiconductor substrate 110, in order to improve a reflectance of the solar cell. In this instance, the back reflective layer formed of silicon oxide (SiOx) or silicon nitride (SiNx) may have a refractive index of about 1.45 to 2.0 and may relatively well reflect light of a long wavelength band, thereby further improving a re-absorptance of the semiconductor substrate 110.

However, the embodiment of the invention can maximize a light reflection at the second electrode 150 formed of the metal foil by forming the second electrode 150 on the back surface of the semiconductor substrate 110 using the metal foil and forming the air gap 300, that is filled with air having an ideal refractive index of 1.0, between the second electrode 150 formed of the metal foil and the back surface of the semiconductor substrate 110. Hence, the embodiment of the invention can maximize an amount of light of a long wavelength band again incident on the semiconductor substrate 110.

As a result, the embodiment of the invention can further improve the efficiency of the solar cell, compared to a solar cell including the back reflective layer formed of silicon oxide (SiOx) or silicon nitride (SiNx) on the back surface of the semiconductor substrate 110.

Further, when the second electrode 150 on the back surface of the semiconductor substrate 110 is formed of the metal foil as described above, a manufacturing process of the solar cell can be further simplified. Namely, in a related art, the second electrode was formed by printing and coating an electrode paste on the back surface of the semiconductor substrate 110 and drying and firing the electrode paste, or was formed through an expensive plating process. However, in the embodiment of the invention, the second electrode 150 may be simply formed by disposing the metal foil on the back surface of the semiconductor substrate 110 and locally performing a thermal process on the metal foil. Hence, the embodiment of the invention can greatly reduce the manufacturing cost of the solar cell.

More specifically, the second electrode 150 according to the embodiment of the invention may be formed by disposing the metal foil on the back surface of the semiconductor substrate 110 and performing a thermal process (for example, laser irradiation, infrared irradiation, hot air, and hot probe) on a local area of the metal foil to connect the metal foil to the back surface of the semiconductor substrate 110. In the formation of the second electrode 150, a portion of the metal foil, on which the thermal process is not performed, may be spaced apart from the back surface of the semiconductor substrate 110 to form the air gap 300.

As shown in FIGS. 1 to 3, the second electrode 150 thus formed may include a contact portion 150a and a non-contact portion 150b.

The contact portion 150a indicates a portion of the metal foil contacting the back surface of the semiconductor substrate 110. The non-contact portion 150b indicates a portion of the metal foil that is spaced apart from the back surface of the semiconductor substrate 110 to form the air gap 300 between the second electrode 150 and the semiconductor substrate 110.

The contact portion 150a of the second electrode 150 may be in point contact or line contact with the back surface of the semiconductor substrate 110. FIG. 2 illustrates that the contact portion 150a is in point contact with the back surface of the semiconductor substrate 110, by way of example.

As shown in FIG. 2, the second electrode 150 may further include an outer contact portion 150c contacting the back surface of the semiconductor substrate 110 at an edge of the metal foil.

The outer contact portion 150c can prevent a material (for example, ethylene vinyl acetate (EVA)) for reducing an impact applied to a solar cell module when the solar cell module is formed from being introduced into the air gap 300 between the semiconductor substrate 110 and the metal foil during a lamination process.

The second electrode 150 formed of the metal foil may be made of at least one of Ag, Al, Au, W, Mo, Ni, Pt, Cu, Ti, Cr, and Fe, or an alloy thereof. The non-contact portion 150b may have a thickness T150b of 20 μm to 30 μm.

Further, a maximum thickness T300 of the air gap 300 may be less or greater than a height of an uneven portion on the back surface of the semiconductor substrate 110. For example, the maximum thickness T300 of the air gap 300 may be 1 μm to 100 μm, preferably, 3 μm to 5 μm, for example.

The contact portion 150a may be further recessed toward the semiconductor substrate 110 than the non-contact portion 150b. More specifically, as shown in FIGS. 1 and 3, at a back surface of the second electrode 150 formed of the metal foil, a formation portion of the contact portion 150a may be further recessed toward the semiconductor substrate 110 than a formation portion of the non-contact portion 150b because of the local thermal processing of the metal foil.

In embodiments of the invention, the contact portion 150a, that is further recessed than the non-contact portion 150b in the second electrode 150 formed of the metal foil, may have, for example, a crater shape, that is recessed from an edge to the center.

Hence, as shown in FIG. 2, an outer shape of the contact portion 150a may have a circle. However, embodiments of the invention are not limited thereto. For example, when the contact portion 150a is in line contact with the back surface of the semiconductor substrate 110, an outer shape of the contact portion 150a may have a groove shape that is recessed while extending in one direction.

A recessed depth Td of the contact portion 150a may be 15 μm to 50 μm, and a recessed width Tw of the contact portion 150a may be 30 μm to 100 μm.

As shown in FIGS. 1 and 3, when the second semiconductor region 170 doped with impurities of the second conductive type is positioned between the semiconductor substrate 110 and the second electrode 150 formed of the metal foil, the contact portion 150a may contact the second semiconductor region 170, and the non-contact portion 150b may be spaced apart from the second semiconductor region 170 to form the air gap 300.

In this instance, an impurity doping concentration of a portion 172 of the second semiconductor region 170 contacting the contact portion 150a may be higher than an impurity doping concentration of a portion 171 of the second semiconductor region 170 not contacting the contact portion 150a.

A lightly doped region 171 having a relatively low impurity doping concentration in the second semiconductor region 170 may be formed by diffusing impurities of the second conductive type into the entire back surface of the semiconductor substrate 110. A heavily doped region 172 having a relatively high impurity doping concentration in the second semiconductor region 170 may be formed by performing the local thermal processing on a metal foil including, for example, aluminum (Al) to connect the metal foil to the second semiconductor region 170 and diffusing aluminum included in the metal foil into the inside of the second semiconductor region 170.

Hence, as shown in FIGS. 1 and 3, a thickness of the heavily doped region 172 of the second semiconductor region 170 may be relatively greater than a thickness of the lightly doped region 171 of the second semiconductor region 170.

So far, the embodiment of the invention described that the second electrode 150 formed of the metal foil directly contacts the second semiconductor region 170, by way of example. However, the embodiment of the invention may be applied to a structure of a solar cell in which a separate electrode layer is formed between the second semiconductor region 170 and the second electrode 150.

This will be described in detail below.

Figure 4:
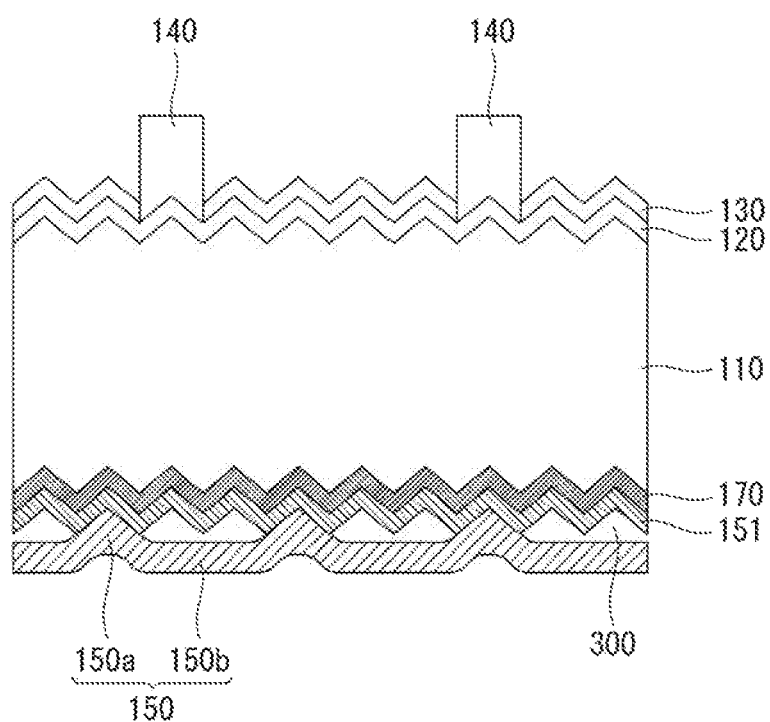
FIG. 4 is a cross-sectional view of a solar cell according to a second embodiment of the invention.

FIG. 4 is a cross-sectional view of a solar cell according to a second embodiment of the invention.

Structures and components identical or equivalent to those described above with reference to FIGS. 1 to 3 are omitted in FIG. 4, and a difference between them is mainly described.

As shown in FIG. 4, the solar cell according to the second embodiment of the invention may include a second semiconductor region 170 including only a lightly doped region at a back surface of a semiconductor substrate 110 and may further include a metal electrode layer 151 connected to an entire back surface of the second semiconductor region 170, unlike FIGS. 1 to 3. Even in this instance, a second electrode 150 formed of a metal foil may be positioned on a back surface of the metal electrode layer 151.

The metal electrode layer 151 may be formed by applying a metal paste to the back surface of the second semiconductor region 170 and drying and firing the metal paste. Hence, the metal electrode layer 151 may be connected to the entire back surface of the second semiconductor region 170.

Further, the metal electrode layer 151 may include the same material as the second electrode 150 formed of the metal foil.

A portion 150a (i.e., a contact portion 150a) of the second electrode 150 formed of the metal foil may contact the metal electrode layer 151, and a remaining portion 150b (i.e., a non-contact portion 150b) of the second electrode 150 may be spaced apart from the metal electrode layer 151 to form an air gap 300 between the second electrode 150 and the metal electrode layer 151.

Hence, even when the metal electrode layer 151 is positioned on the back surface of the semiconductor substrate 110 and is connected to the entire back surface of the semiconductor substrate 110, a back reflectance of the semiconductor substrate 110 can be greatly improved due to the second electrode 150 formed of the metal foil.

Further, the embodiment of the invention may be applied to a solar cell, in which other functional layers other than the metal electrode layer 151 are formed on the back surface of the semiconductor substrate 110.

This will be described in detail below.

Figure 5A:
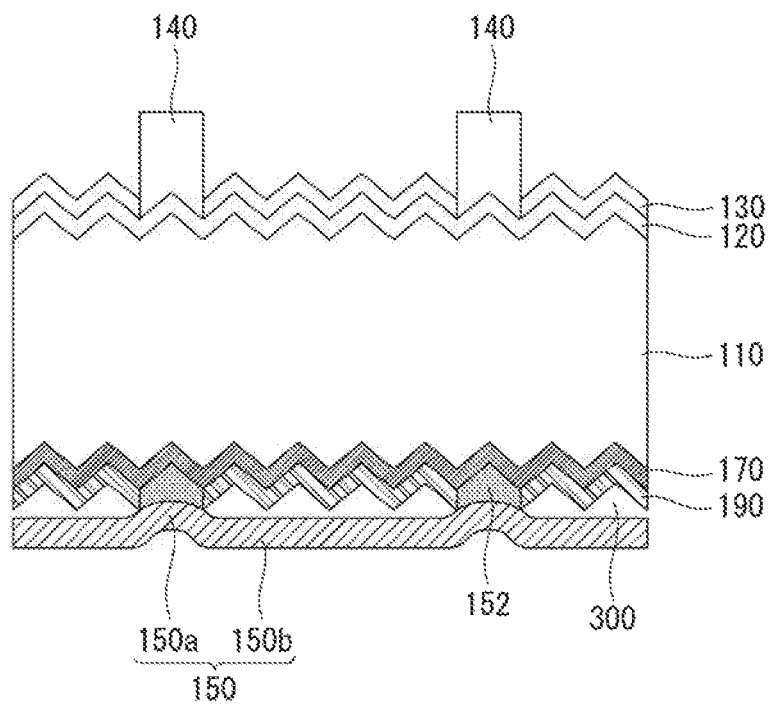
FIGS. 5A and 5B are cross-sectional views of a solar cell according to a third embodiment of the invention.
Figure 5B:
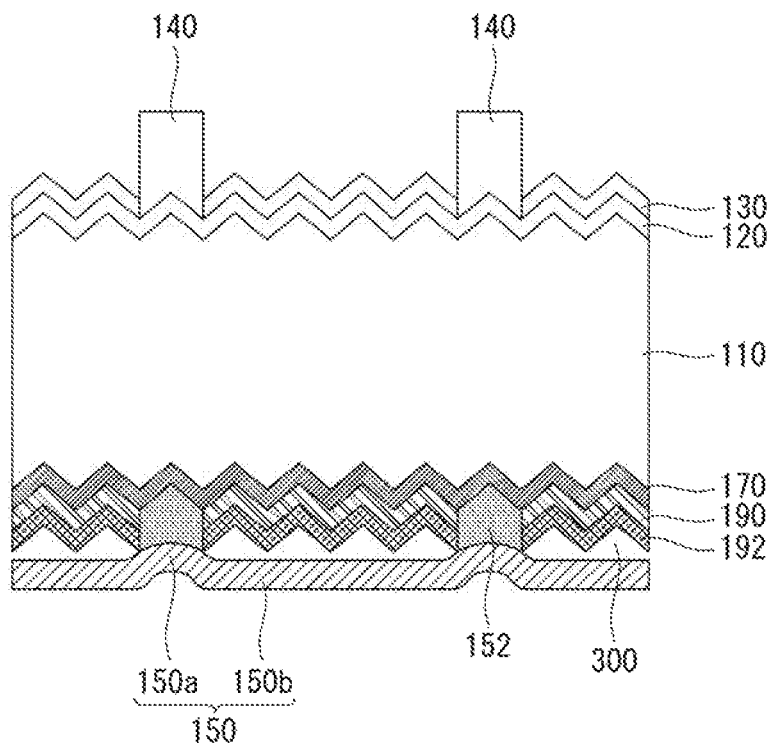

FIGS. 5A and 5B are cross-sectional views of a solar cell according to a third embodiment of the invention.

Structures and components identical or equivalent to those described above with reference to FIGS. 1 to 4 are omitted in FIGS. 5A and 5B, and a difference between them is mainly described.

As shown in FIG. 5A, a back passivation layer 190 formed of a dielectric material may be further disposed on a back surface of a second semiconductor region 170. A conductive contact electrode 152 may be positioned to pass through the back passivation layer 190.

The back passivation layer 190 may be formed of at least one of SiOx, SiNx, SiOxNy, or AlOx and may have a thickness of 30 nm to 70 nm.

When the back passivation layer 190 is further disposed between the second semiconductor region 170 and a second electrode 150 formed of a metal foil as described above, a contact portion 150a of the second electrode 150 formed of the metal foil may contact the second semiconductor region 170 through the conductive contact electrode 152 passing through the back passivation layer 190.

A non-contact portion 150b of the second electrode 150 formed of the metal foil may be spaced apart from the back passivation layer 190 to form an air gap 300 between the second electrode 150 formed of the metal foil and the back passivation layer 190.

Thus, the embodiment of the invention may be applied to the solar cell in which the back passivation layer 190 is positioned on a back surface of a semiconductor substrate 110. In this instance, the second electrode 150 formed of the metal foil may replace a back reflective layer inducing a back reflection and perform a function of the back reflective layer. Thus, efficiency of the solar cell can be further improved, and the manufacturing cost of the solar cell may be further reduced.

However, the embodiment of the invention is not applied only to a solar cell in which the back reflective layer is removed. As shown in FIG. 5B, the embodiment of the invention may be applied to a solar cell in which a back reflective layer 192 is disposed on a back surface of the back passivation layer 190.

More specifically, as shown in FIG. 5B, even when the back passivation layer 190 and the back reflective layer 192 are sequentially disposed on the back surface of the second semiconductor region 170, the contact portion 150a of the second electrode 150 formed of the metal foil may contact the second semiconductor region 170 through a conductive contact electrode 152, that passes through the back passivation layer 190 and the back reflective layer 192 and is connected to the second semiconductor region 170. Further, the non-contact portion 150b of the second electrode 150 may be spaced apart from the back reflective layer 192 to form an air gap 300 between the second electrode 150 formed of the metal foil and the back reflective layer 192.

In this instance, because both the second electrode 150 formed of the metal foil and the back reflective layer 192 are included in the solar cell, a back reflectance of the solar cell can be further improved.

Further, the back reflective layer 192 may be formed of at least one of SiOx, SiNx, SiOxNy, or SiC. A thickness of the back reflective layer 192 may be greater than a thickness of the back passivation layer 190 and may be in a range of 50 nm to 200 nm.

So far, the embodiment of the invention described that the first and second semiconductor regions are formed by doping impurities of the first and second conductive types into the semiconductor substrate 110 formed of the crystalline silicon material, by way of example.

However, the embodiment of the invention may be applied to a heterojunction solar cell in which first and second semiconductor regions formed of an amorphous silicon material are deposited on a semiconductor substrate 110 formed of a crystalline silicon material. This will be described in detail below.

Figure 6A:
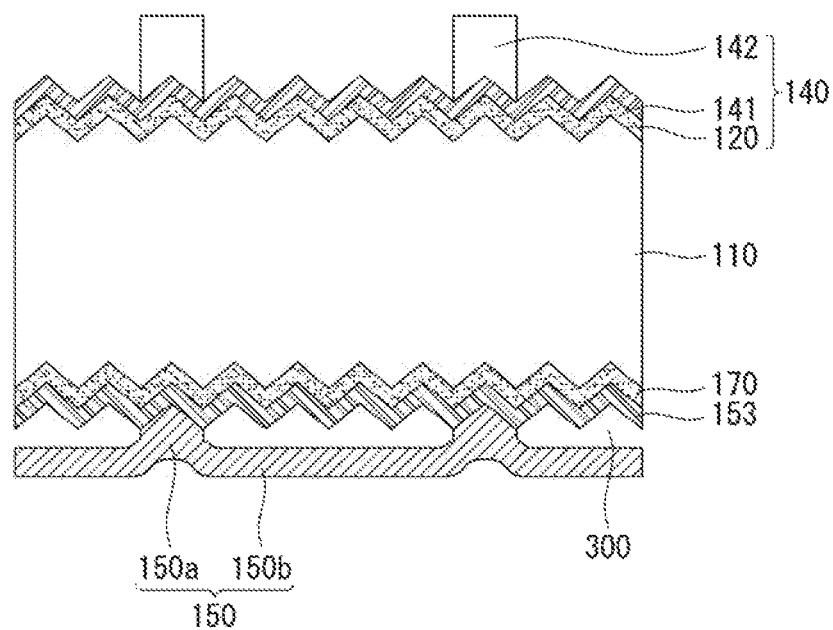
FIGS. 6A and 6B are cross-sectional views of a solar cell according to a fourth embodiment of the invention.
Figure 6B:
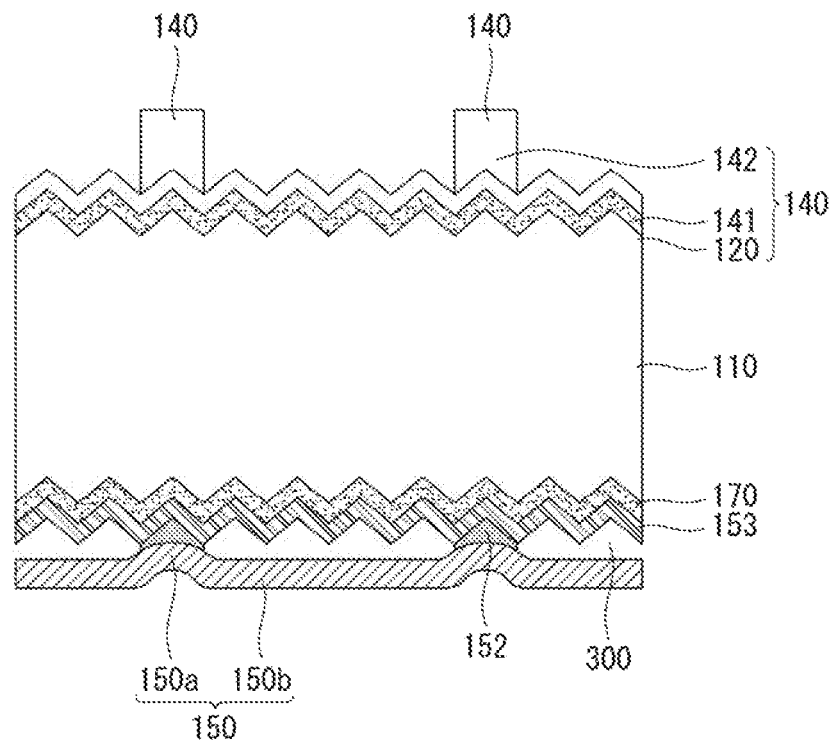

FIGS. 6A and 6B are cross-sectional views of a solar cell according to a fourth embodiment of the invention.

Structures and components identical or equivalent to those described above with reference to FIGS. 1 to 5B are omitted in FIGS. 6A and 6B, and a difference between them is mainly described.

As shown in FIG. 6A, the solar cell according to the fourth embodiment of the invention may include a first semiconductor region 120 at a front surface of a semiconductor substrate 110 and a second semiconductor region 170 at a back surface of the semiconductor substrate 110. The semiconductor substrate 110 may be formed of a crystalline silicon material, and the first and second semiconductor regions 120 and 170 may be formed of an amorphous silicon material.

A first electrode 140 connected to the first semiconductor region 120 may include a first transparent electrode layer 141 and a grid electrode 142. The first transparent electrode layer 141 may be positioned on an entire front surface of the first semiconductor region 120 and may be formed of transparent conductive oxide (TCO). The grid electrode 142 may be positioned on a front surface of the first transparent electrode layer 141 and connected to the first transparent electrode layer 141. The first transparent electrode layer 141 has the conductivity and the light transmission and thus can serve as an anti-reflection layer.

A second transparent electrode layer 153 formed of transparent conductive oxide may be positioned on a back surface of the second semiconductor region 170 formed of the amorphous silicon material. A second electrode 150 formed of a metal foil may be positioned on a back surface of the second transparent electrode layer 153.

A contact portion 150a of the second electrode 150 formed of the metal foil may directly contact the second transparent electrode layer 153. A non-contact portion 150b of the second electrode 150 formed of the metal foil may be spaced apart from the second transparent electrode layer 153 to form an air gap 300.

FIG. 6A illustrates that the contact portion 150a of the second electrode 150 formed of the metal foil directly contacts the second transparent electrode layer 153, by way of example. Unlike FIG. 6A, as shown in FIG. 6B, a conductive contact electrode 152 may be positioned on the back surface of the second transparent electrode layer 153, and the contact portion 150a may contact the second transparent electrode layer 153 through the conductive contact electrode 152.

When the second electrode 150 formed of the metal foil is applied to such a heterojunction solar cell, the manufacturing cost of the second electrode 150 can be further reduced compared to when the second electrode 150 is formed using an electrode paste. In addition, a manufacturing process of the solar cell can be simplified.

Because a back reflection is generated at a boundary between the second transparent electrode layer 153 and the air gap 300 and at a boundary between the air gap 300 and the second electrode 150 formed of the metal foil due to the air gap 300, efficiency of the solar cell can be further improved.

In general, a heterojunction solar cell using amorphous silicon uses a metal paste of low temperature firing, and a sheet resistance of the second transparent electrode layer 153 greatly affects a serial resistance of the component. In the embodiments of the invention, because the second electrode 150 formed of the metal foil is formed throughout the entire back surface of the semiconductor substrate 110, the embodiments of the invention are advantageous to a reduction in a serial resistance.

So far, the first to fourth embodiments of the invention described a conventional solar cell, in which the first electrode 140 is positioned on the front surface of the semiconductor substrate 110 and the second electrode 150 is positioned on the back surface of the semiconductor substrate 110, by way of example. However, embodiments of the invention are not limited thereto. For example, embodiments of the invention may be applied to a back contact solar cell, in which both first and second electrodes are positioned on a back surface of a semiconductor substrate. This will be described in detail below.

Figure 7:
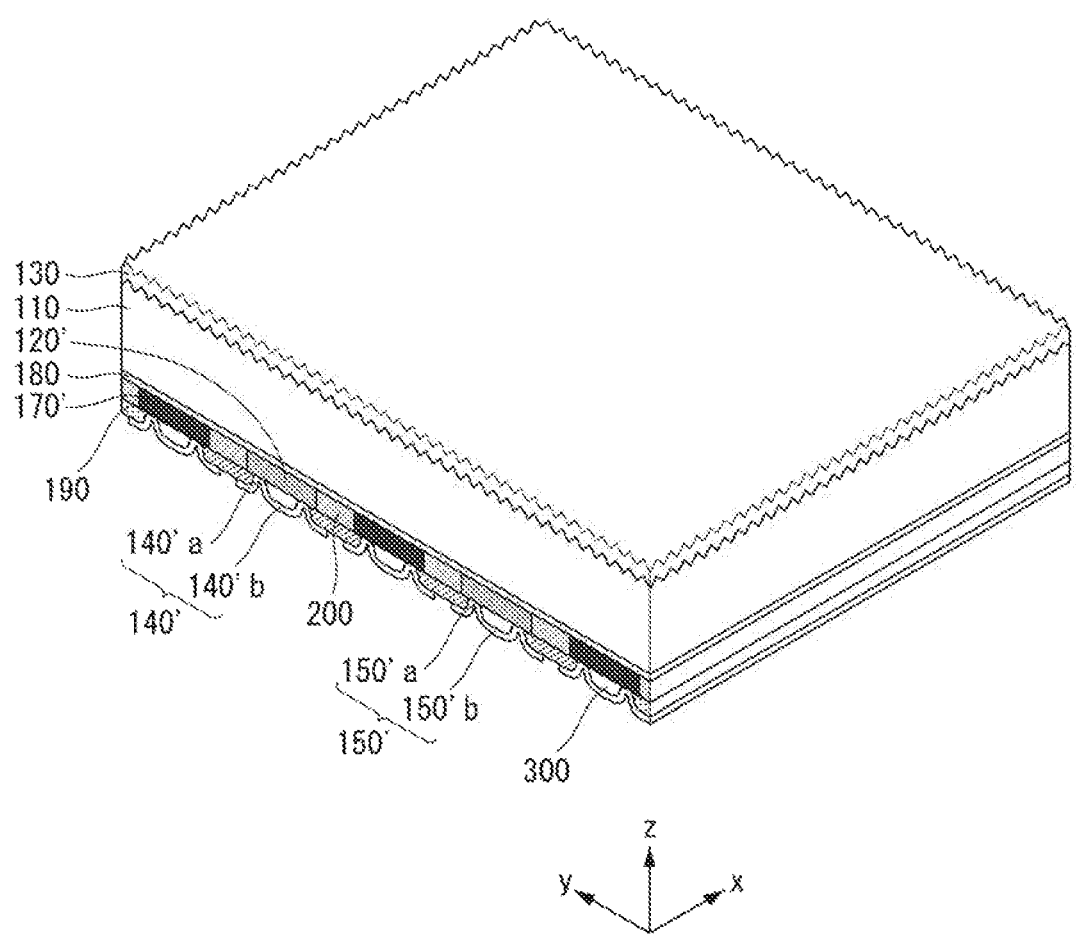
FIGS. 7 to 9B illustrate a solar cell according to a fifth embodiment of the invention.
Figure 8:
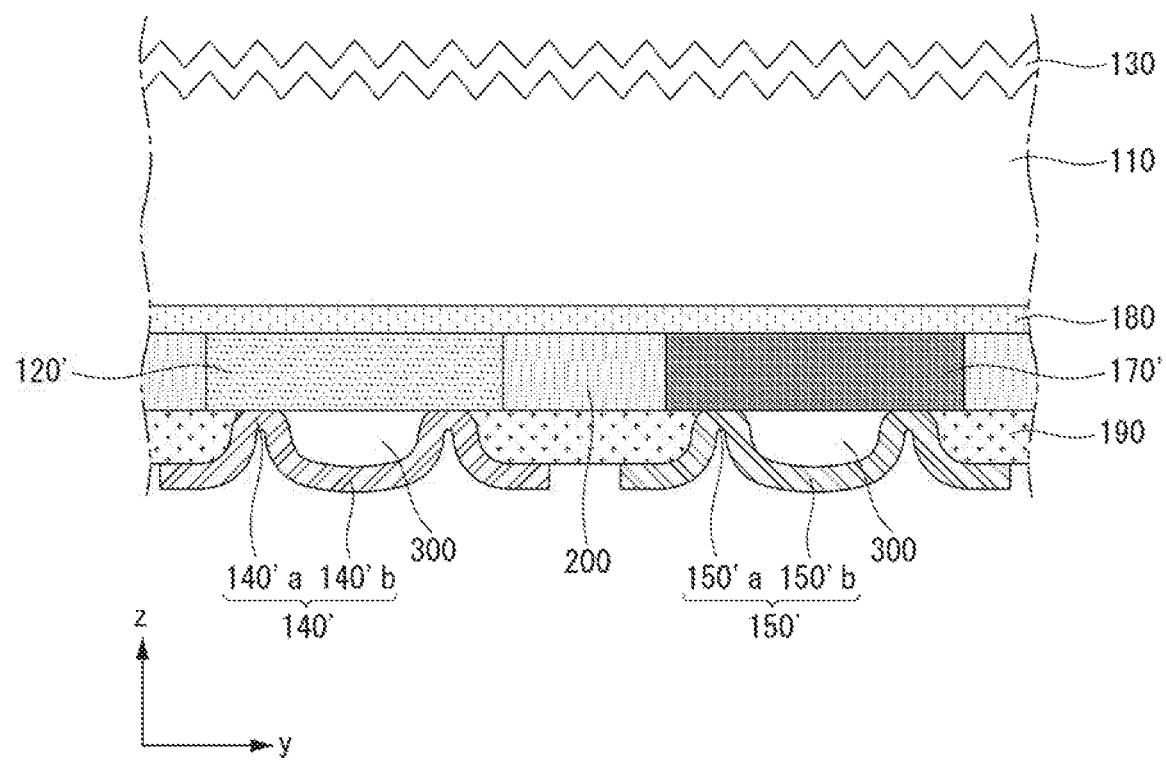
Figure 9A:
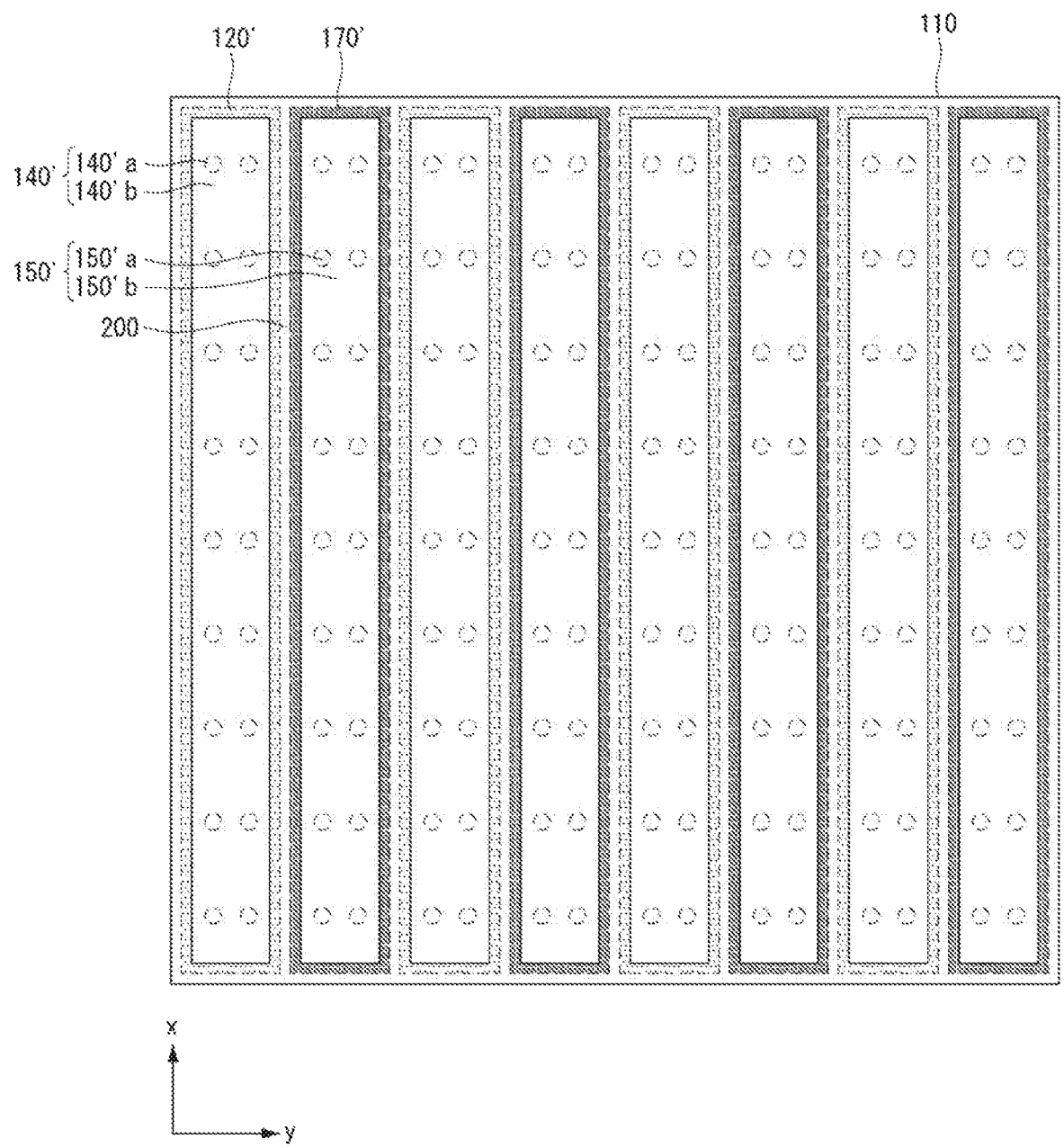
Figure 9B:
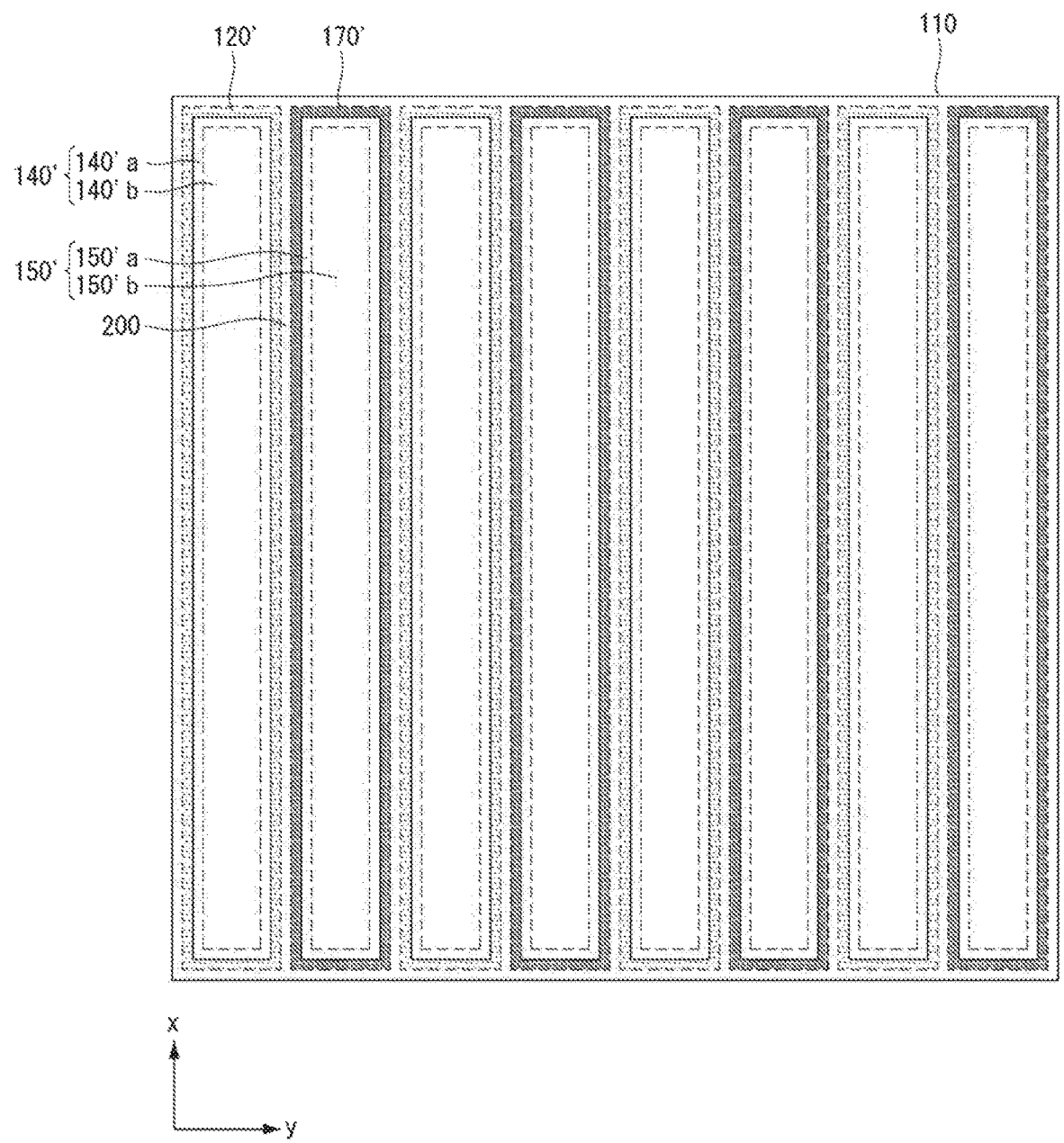

FIGS. 7 to 9B illustrate a solar cell according to a fifth embodiment of the invention. More specifically, FIG. 7 is a partial perspective view of the solar cell according to the fifth embodiment of the invention; FIG. 8 is a cross-sectional view of the solar cell according to the fifth embodiment of the invention; FIG. 9A illustrates an example of a back pattern of the solar cell according to the fifth embodiment of the invention; and FIG. 9B illustrates another example of the back pattern of the solar cell according to the fifth embodiment of the invention.

As shown in FIGS. 7 and 8, the solar cell according to the fifth embodiment of the invention may include a semiconductor substrate 110, an anti-reflection layer 130, a tunnel layer 180, a plurality of first semiconductor regions 120', a plurality of second semiconductor regions 170', a plurality of intrinsic semiconductor regions 200, a plurality of first electrodes 140', a plurality of second electrodes 150', and a back passivation layer 190.

Since the semiconductor substrate 110 and the anti-reflection layer 130 according to the fifth embodiment of the invention are substantially the same as those described in the first to fourth embodiments of the invention, a further description may be briefly made or may be entirely omitted. A difference between the fifth embodiment and the first to fourth embodiments of the invention is mainly described.

The fifth embodiment of the invention is described based on an example in which a semiconductor substrate 110 is doped with impurities of a second conductive type.

In the fifth embodiment of the invention, as shown in FIGS. 7 and 8, the tunnel layer 180 may be disposed on an entire back surface of the semiconductor substrate 110 and may directly contact the back surface of the semiconductor substrate 110.

The tunnel layer 180 may pass through carriers produced in the semiconductor substrate 110 and may perform a passivation function with respect to the back surface of the semiconductor substrate 110. To this end, a thickness of the tunnel layer 180 may be 0.5 nm to 5 nm.

The tunnel layer 180 may be formed of a dielectric material including silicon carbide (SiCx) or silicon oxide (SiOx) having strong durability at a high temperature equal to or higher than 600° C. Other materials may be used.

The plurality of first semiconductor regions 120' may be positioned at the back surface of the semiconductor substrate 110 and may be formed of polycrystalline silicon material doped with impurities of a first conductive type. Thus, each first semiconductor region 120' may serve as an emitter region.

Each first semiconductor region 120' may directly contact a portion of a back surface of the tunnel layer 180 on the back surface of the semiconductor substrate 110. The plurality of first semiconductor regions 120' may be disposed to extend in a first direction x and may form a p-n junction together with the semiconductor substrate 110 with the tunnel layer 180 interposed between them.

The plurality of second semiconductor regions 170' may be positioned at the back surface of the semiconductor substrate 110 and may be formed of polycrystalline silicon material that is more heavily doped than the semiconductor substrate 110 with impurities of the second conductive type. Thus, each second semiconductor region 170' may serve as a back surface field region.

Each second semiconductor region 170' may directly contact a portion (spaced apart from each first semiconductor region 120') of the back surface of the tunnel layer 180 on the back surface of the semiconductor substrate 110. The plurality of second semiconductor regions 170' may be disposed to extend in the first direction x in parallel with the first semiconductor regions 120'.

FIGS. 7 and 8 illustrate that the first semiconductor regions 120' and the second semiconductor regions 170' are formed on the back surface of the tunnel layer 180 using the polycrystalline silicon material, by way of example. However, if the tunnel layer 180 is omitted unlike FIGS. 7 and 8, the first semiconductor regions 120' and the second semiconductor regions 170' may be doped by diffusing impurities into the back surface of the semiconductor substrate 110. In this instance, the first semiconductor regions 120' and the second semiconductor regions 170' may be formed of the same material (for example, a silicon material) as the semiconductor substrate 110.

Each of the plurality of intrinsic semiconductor layers 200 may be formed on the back surface of the tunnel layer 180 exposed between the first semiconductor region 120' and the second semiconductor region 170'. The intrinsic semiconductor layers 200 may be formed of an intrinsic polycrystalline silicon material, that is not doped with impurities of the first conductive type or impurities of the second conductive type, unlike the first semiconductor regions 120' and the second semiconductor regions 170'.

Further, as shown in FIGS. 7 and 8, the intrinsic semiconductor layer 200 may be configured such that both sides directly contact the side of the first semiconductor region 120' and the side of the second semiconductor region 170', respectively.

The intrinsic semiconductor layer 200 is not an essential component and thus may be omitted if desired or necessary. If the intrinsic semiconductor layer 200 is omitted, the first semiconductor region 120' and the second semiconductor region 170' may be spaced apart from each other, or may be directly connected to each other.

The plurality of first electrodes 140' may be positioned on the back surface of the semiconductor substrate 110 and may be connected to the first semiconductor regions 120'. As shown in FIGS. 9A and 9B, the first electrodes 140' may be disposed to extend in the first direction x. The first electrodes 140' may collect carriers moving to the first semiconductor regions 120'.

The plurality of second electrodes 150' may be positioned on the back surface of the semiconductor substrate 110 and may be connected to the second semiconductor regions 170'. As shown in FIGS. 9A and 9B, the second electrodes 150' may be disposed to extend in the first direction x in parallel with the first electrodes 140'. The second electrodes 150' may collect carriers moving to the second semiconductor region 170'.

The first and second electrodes 140' and 150' may extend in the first direction x and may be alternately disposed in a second direction y.

The back passivation layer 190 may remove a defect resulting from a dangling bond formed at a back surface of a polycrystalline silicon layer formed at the first semiconductor region 120', the second semiconductor region 170', and the intrinsic semiconductor layer 200. Thus, the back passivation layer 190 can reduce or prevent carriers produced in the semiconductor substrate 110 from being recombined and disappeared by the dangling bond.

However, the back passivation layer 190 is not an essential component and thus may be omitted if desired or necessary.

In the solar cell having the above-described structure according to the embodiment of the invention, holes collected by the first electrodes 140' and electrons collected by the second electrodes 150' may be used as electric power of an external device through an external circuit device.

The solar cell applied to a solar cell module according to the embodiment of the invention is not limited to FIGS. 7 and 8. The components of the solar cell may be variously changed, except that the first and second electrodes 140' and 150' included in the solar cell are formed on the back surface of the semiconductor substrate 110.

For example, the solar cell module according to the embodiment of the invention may use a metal wrap through (MWT) solar cell, that is configured such that a portion of the first electrode 140' and the first semiconductor region 120' are positioned on the front surface of the semiconductor substrate 110, and the portion of the first electrode 140' is connected to a remaining portion of the first electrode 140' formed on the back surface of the semiconductor substrate 110 through a hole of the semiconductor substrate 110.

As shown in FIGS. 7 and 8, each of the first electrode 140' and the second electrode 150' according to the fifth embodiment of the invention may be formed of a metal foil covering the first semiconductor region 120' and the second semiconductor region 170'. An air gap 300 may be formed between the first and second electrodes 140' and 150' formed of the metal foil and the first and second semiconductor regions 120' and 170'.

In the solar cell in which the first and second electrodes 140' and 150' are formed of the metal foil and the air gap 300 is formed between the first and second electrodes 140' and 150' formed of the metal foil and the first and second semiconductor regions 120' and 170', a back reflectance of the semiconductor substrate 110 can be further improved, and the manufacturing cost of the solar cell can be reduced by simplifying a method for forming the first and second electrodes 140' and 150'.

As shown in FIGS. 7 and 8, the first electrode 140' formed of the metal foil may include a first contact portion 140'$a$ contacting a back surface of the first semiconductor region 120' and a first non-contact portion 140'$b$ that is spaced apart from the first semiconductor region 120' to form the air gap 300 between the first non-contact portion 140'$b$ and the first semiconductor region 120'.

Further, the second electrode 150' formed of the metal foil may include a second contact portion 150'$a$ contacting a back surface of the second semiconductor region 170' and a second non-contact portion 150'$b$ that is spaced apart from the second semiconductor region 170' to form the air gap 300 between the second non-contact portion 150'$b$ and the second semiconductor region 170'.

The first and second electrodes 140' and 150' formed of the metal foil may be made of at least one of Ag, Al, Au, W, Mo, Ni, Pt, Cu, Ti, Cr, and Fe, or an alloy thereof. A thickness of each of the first and second non-contact portions 140'$b$ and 150'$b$ may be 20 µm to 30 µm.

The first and second contact portions 140'$a$ and 150'$a$ may be further recessed toward the semiconductor substrate 110 than the first and second non-contact portions 140'$b$ and 150'$b$.

More specifically, as shown in FIGS. 7 and 8, a portion of a back surface of each of the first and second electrodes 140' and 150' formed of the metal foil, on which the first and second contact portions 140'$a$ and 150'$a$ are positioned, may be further recessed toward the semiconductor substrate 110 than a portion, on which the first and second non-contact portions 140'$b$ and 150'$b$ are positioned, due to an influence of the local thermal processing of the metal foil.

In each of the first and second electrodes 140' and 150' formed of the metal foil, the first contact portion 140'$a$ may be in point contact or line contact with the back surface of the first semiconductor region 120', and the second contact portion 150'a may be in point contact or line contact with the back surface of the second semiconductor region 170'.

For example, as shown in FIG. 9A, when the first and second electrodes 140' and 150' formed of the metal foil are extended in the first direction x and the first and second contact portions 140'a and 150'a are in point contact with the first and second semiconductor regions 120' and 170', respectively, a pair of first contact portions 140'a may be formed at both ends of the first electrode 140' in the second direction y, and a pair of second contact portions 150'a may be formed at both ends of the second electrode 150' in the second direction y. Further, the pairs of the first contact portions 140'a may be spaced apart from each other in the first direction x, and a plurality of pairs of the second contact portions 150'a may be spaced apart from one another in the first direction x.

Alternatively, as shown in FIG. 9B, unlike the point contact, when the first and second electrodes 140' and 150' formed of the metal foil are extended in the first direction x and the first and second contact portions 140'a and 150'a are in line contact with the first and second semiconductor regions 120' and 170', respectively, the first and second contact portions 140'a and 150'a may be formed in a line shape along edges of the first and second electrodes 140' and 150', respectively.

The embodiment of the invention can further improve the back reflectance of the semiconductor substrate 110 by forming the electrodes using the metal foil and forming the air gap 300 between the metal foil and the semiconductor substrate 110, and can also reduce the manufacturing cost of the solar cell by simplifying the forming method of the electrodes.

So far, the solar cells according to various embodiments of the invention were described. Hereinafter, a cross section of a solar cell module manufactured by modularizing solar cells is briefly described.

Figure 10:
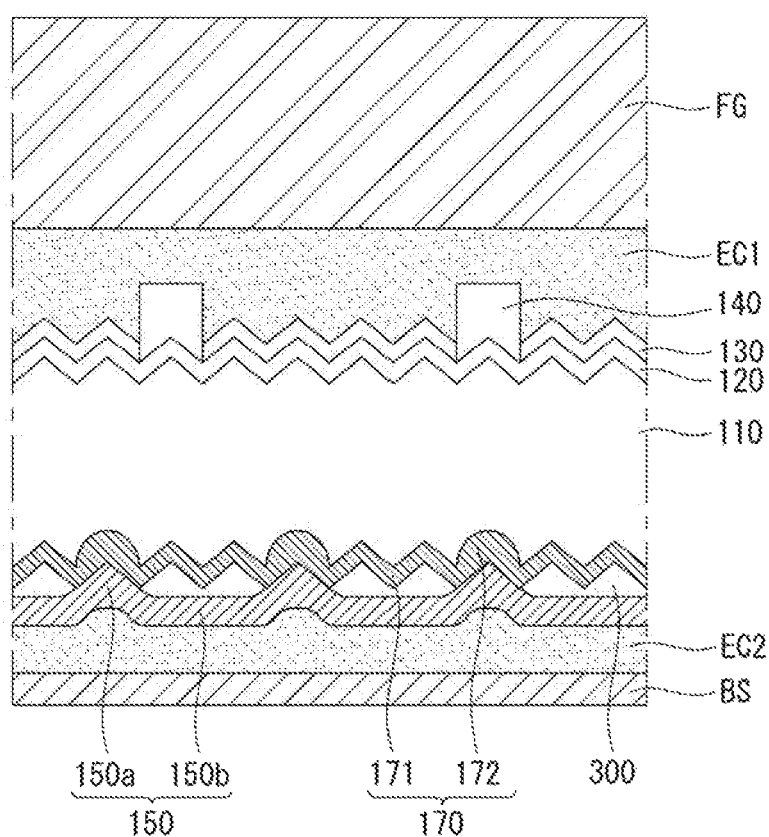
FIG. 10 illustrates an example of a cross-section of a solar cell module to which a solar cell according to an embodiment of the invention is applied.

FIG. 10 illustrates an example of a cross-section of a solar cell module to which a solar cell according to an embodiment of the invention is applied.

More specifically, FIG. 10 illustrates a modularized cross section of the solar cells according to the first embodiment of the invention described with reference to FIGS. 1 to 3, by way of example. In FIG. 10, interconnectors connecting a plurality of solar cells in series are omitted for convenience of explanation.

As shown in FIG. 10, a solar cell module to which a solar cell according to an embodiment of the invention is applied, may include a front transparent substrate FG, a back sheet BS, a first encapsulant EC1, a second encapsulant EC2, and a solar cell.

The front transparent substrate FG may be positioned on a front surface of the solar cell and may be formed of a material, for example, a tempered glass having a high transmittance and an excellent damage prevention function.

The first encapsulant EC1 may be positioned between the front transparent substrate FG and the solar cell. The second encapsulant EC2 may be positioned between the solar cell and the back sheet BS positioned at a back surface of the solar cell.

The first encapsulant EC1 and the second encapsulant EC2 may be formed of a material for preventing a metal corrosion resulting from moisture penetration and protecting the solar cell module from an impact.

A lamination process may be performed on the first encapsulant EC1 and the second encapsulant EC2, that are respectively disposed on a front surface and the back surface of the solar cell, to form one body of the first and second encapsulants EC1 and EC2 and the solar cell.

The first encapsulant EC1 and the second encapsulant EC2 may be formed of ethylene vinyl acetate (EVA), etc.

The back sheet BS may be positioned on a back surface of the second encapsulant EC2 and can prevent moisture and oxygen from penetrating into a back surface of the solar cell module.

The back sheet BS may be formed as a thin sheet made of an insulating material, such as fluoropolymer/polyester/fluoropolymer (FP/PE/FP). Insulating sheets made of other insulating materials may be used in the back sheet BS.

In the cross-section of the solar cell module shown in FIG. 10, the solar cell, the first encapsulant EC1, and the second encapsulant EC2 may be formed as one body between the front transparent substrate FG and the back sheet BS by the lamination process.

In this instance, because a second electrode 150 formed of a metal foil covers an entire back surface of a semiconductor substrate 110, the second encapsulant EC2 does not penetrate into an air gap 300 between the second electrode 150 formed of the metal foil and the back surface of the semiconductor substrate 110. Further, after the lamination process, the air gap 300 may exist in the complete solar cell module.

Hence, efficiency of the solar cell module including the solar cell according to the embodiment of the invention can be improved by the air gap 300 provided in the back surface of the semiconductor substrate 110.

FIG. 10 illustrates the solar cell according to the first embodiment of the invention by way of example. However, embodiments of the invention are not limited thereto, and may be equally applied to the second to fifth embodiments as well as the first embodiment. Hence, in a solar cell module to which the solar cells according to the second to fifth embodiments are applied, the air gap between the electrode formed of the metal foil and the back surface of the semiconductor substrate can exist in the complete solar cell module after the lamination process by applying the electrode formed of the metal foil to the solar cell module. Further, efficiency of the solar cell module can be improved by the air gap provided in the back surface of the semiconductor substrate.

So far, the embodiments of the invention described only the structure of the electrode formed of the metal foil and the air gap. Hereinafter, a method of manufacturing the solar cell according to the embodiments of the invention is described.

Figure 11:
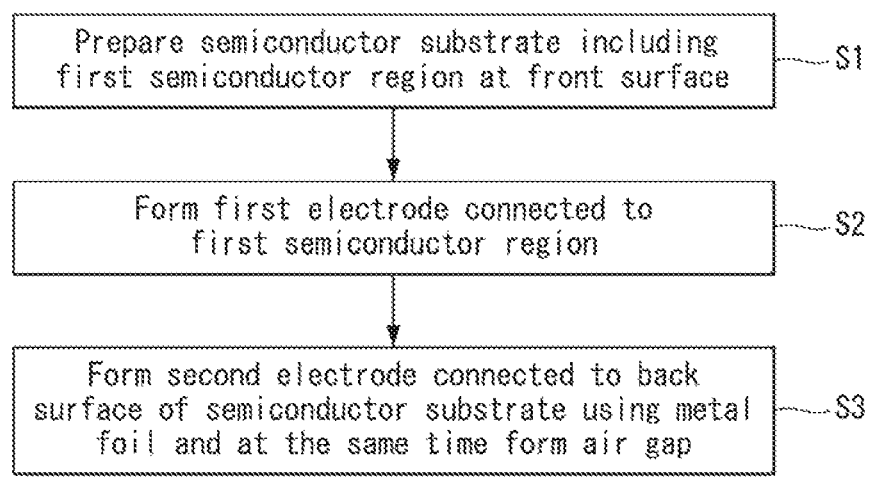
FIG. 11 is a flow chart illustrating a method of manufacturing a solar cell according to a first embodiment of the invention.

FIG. 11 is a flow chart illustrating a method of manufacturing the solar cell according to the first embodiment of the invention.

The method of manufacturing the solar cell according to the first embodiment of the invention illustrated in FIG. 11 may be applied to manufacture the solar cells according to the second to fourth embodiments of the invention that describe a conventional solar cell by way of example.

The method of manufacturing the solar cell according to the first embodiment of the invention may include a semiconductor substrate preparing operation S1, a first electrode forming operation S2, and a second electrode forming operation S3.

FIG. 11 illustrates that the first electrode forming operation S2 and the second electrode forming operation S3 are sequentially performed, by way of example. However, embodiments of the invention are not limited thereto. For example, the order of the first electrode forming operation S2 and the second electrode forming operation S3 may be reversed.

A semiconductor substrate 110 prepared in the semiconductor substrate preparing operation S1 may include a first semiconductor region 120, that is doped with impurities of a first conductive type at a front surface of the semiconductor substrate 110, and a second semiconductor region 170, that is doped with impurities of a second conductive type opposite the first conductive type at a back surface of the semiconductor substrate 110. In another embodiment, the semiconductor substrate 110 not including the second semiconductor region 170 may be used.

In the first electrode forming operation S2, a first electrode 140 connected to the first semiconductor region 120 may be formed as described above with reference to FIGS. 1 to 6B.

The second electrode forming operation S3 may form a second electrode 150 connected to the back surface of the semiconductor substrate 110 using a metal foil, and at the same time form an air gap 300 between the metal foil and the back surface of the semiconductor substrate 110.

Hence, as described above with reference to FIGS. 1 to 6B, the second electrode 150 formed of the metal foil may include a contact portion 150a contacting the back surface of the semiconductor substrate 110 and a non-contact portion 150b that is spaced apart from the back surface of the semiconductor substrate 110 to form the air gap 300 between the semiconductor substrate 110 and the second electrode 150.

For example, when the second semiconductor region 170 is formed at the back surface of the semiconductor substrate 110, the second electrode forming operation S3 may form the second electrode 150 connected to the second semiconductor region 170 using a metal foil, and at the same time form an air gap 300 between the metal foil and the back surface of the semiconductor substrate 110.

In this instance, a contact portion 150a of the second electrode 150 formed of the metal foil may contact the second semiconductor region 170, and a non-contact portion 150b of the second electrode 150 formed of the metal foil may be spaced apart from the back surface of the semiconductor substrate 110 to form the air gap 300 between the semiconductor substrate 110 and the second electrode 150.

In the second electrode forming operation S3, as shown in FIGS. 2 and 3, a thermal process may be performed on the contact portion 150a of an entire portion of the metal foil to bring the contact portion 150a into contact with the back surface of the semiconductor substrate 110. In this instance, the thermal process may be locally performed on the contact portion 150a of the metal foil covering the entire back surface of the semiconductor substrate 110.

In the second electrode forming operation S3, the thermal process may be performed using at least one of laser irradiation, infrared irradiation, hot air, or hot probe.

For example, when the thermal process is performed using the laser irradiation, a laser may be selectively irradiated onto the contact portion 150a of the metal foil to bring the metal foil into contact with the second semiconductor region 170. In this instance, a portion of the metal foil, onto which the laser is not irradiated, may be formed as the non-contact portion 150b, and the air gap 300 may be formed between the non-contact portion 150b of the metal foil and the back surface of the semiconductor substrate 110.

In embodiments of the invention, the laser may use Nd:YAG laser having a wavelength of about 1,064 nm and may be irradiated using a pulse irradiation method.

In embodiments of the invention, an intensity of the laser may be selected between 6 mJ/cm$^2$ to 500 mJ/cm$^2$ depending on a thickness and a material of the metal foil.

When the intensity of the laser is equal to or greater than 6 mJ/cm$^2$, a bad contact of the metal foil can be prevented or reduced. Further, when the intensity of the laser is equal to or less than 500 mJ/cm$^2$ or the laser is irradiated using not a continuous wave irradiation method but a pulse irradiation method, the metal foil can be prevented or reduced from being removed by the burn of the metal foil, or a damage of the contact portion 150a of the metal foil can be prevented or reduced.

FIG. 11 illustrated and described the method of manufacturing the conventional solar cell, in which the first electrode 140 is positioned on the front surface of the semiconductor substrate 110 and the second electrode 150 is positioned on the back surface of the semiconductor substrate 110. Hereinafter, a method of manufacturing a back contact solar cell, in which both first and second electrodes are positioned on a back surface of a semiconductor substrate 110, is described.

Figure 12:
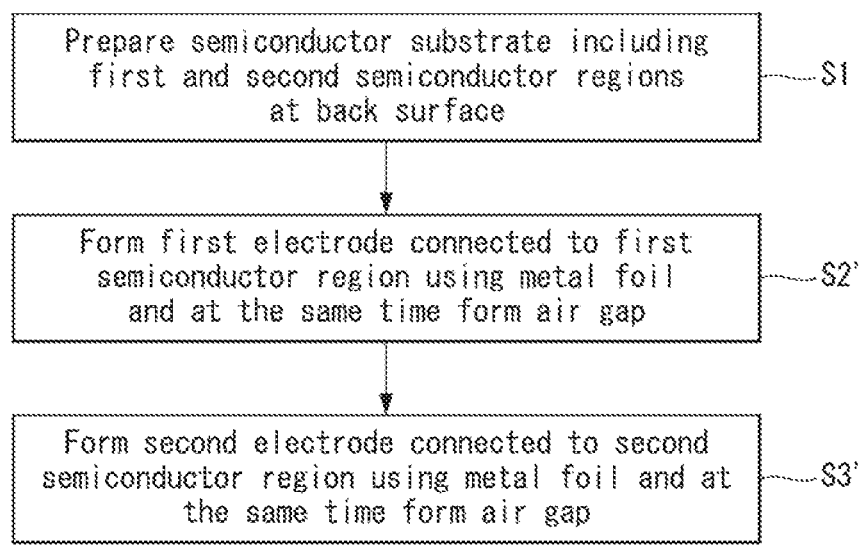
FIG. 12 is a flow chart illustrating a method of manufacturing a solar cell according to a second embodiment of the invention.

FIG. 12 is a flow chart illustrating a method of manufacturing the solar cell according to the second embodiment of the invention.

The method of manufacturing the solar cell according to the second embodiment of the invention illustrated in FIG. 12 may be applied to manufacture the solar cell according to the fifth embodiment of the invention that describes a back contact solar cell by way of example.

The method of manufacturing the solar cell according to the second embodiment of the invention may include a semiconductor substrate preparing operation S1, a first electrode forming operation S2', and a second electrode forming operation S3'.

In embodiments of the invention, the order of the first electrode forming operation S2' and the second electrode forming operation S3' may be reversed.

A semiconductor substrate 110 prepared in the semiconductor substrate preparing operation S1 may include a first semiconductor region 120' and a second semiconductor region 170' that extend in the first direction x at a back surface of the semiconductor substrate 110 and are spaced apart from each other as shown in FIGS. 7 and 8.

The first electrode forming operation S2' may be performed in a state where the semiconductor substrate 110 including the first and second semiconductor regions 120' and 170' at the back surface of the semiconductor substrate 110 is prepared.

The first electrode forming operation S2' may form a first electrode 140' connected to the first semiconductor region 120' using a metal foil, and at the same time form an air gap 300 between the metal foil and the back surface of the semiconductor substrate 110.

As described above with reference to FIGS. 7 to 9B, the first electrode 140' formed of the metal foil in the first electrode forming operation S2' may include a first contact portion 140'a contacting a back surface of the first semiconductor region 120' and a first non-contact portion 140'b that is spaced apart from the first semiconductor region 120' to form the air gap 300 between the first semiconductor region 120' and the first electrode 140'.

In the first electrode forming operation S2', a thermal process may be performed on the first contact portion 140'a of the metal foil in a state where the metal foil is disposed to entirely cover the first semiconductor region 120'.

In this instance, since the thermal process illustrated in FIG. 12 is substantially the same as the thermal process used in the method of manufacturing the solar cell according to the first embodiment of the invention illustrated in FIG. 11, a further description may be briefly made or may be entirely omitted.

Next, the second electrode forming operation S3' may form a second electrode 150' connected to the second semiconductor region 170' using a metal foil, and at the same time form an air gap 300 between the metal foil and the back surface of the semiconductor substrate 110.

As described above with reference to FIGS. 7 to 9B, the second electrode 150' formed of the metal foil in the second electrode forming operation S3' may include a second contact portion 150'a contacting a back surface of the second semiconductor region 170' and a second non-contact portion 150'b that is spaced apart from the second semiconductor region 170' to form the air gap 300 between the second semiconductor region 170' and the second electrode 150'.

In the second electrode forming operation S3', a thermal process may be performed on the second contact portion 150'a of the metal foil in a state where the metal foil is disposed to entirely cover the second semiconductor region 170'.

In this instance, since the thermal process illustrated in FIG. 12 is substantially the same as the thermal process used in the method of manufacturing the solar cell according to the first embodiment of the invention illustrated in FIG. 11, a further description may be briefly made or may be entirely omitted.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
a semiconductor substrate;
a first semiconductor region positioned at a front surface or a back surface of the semiconductor substrate and doped with impurities of a first conductive type;
a first electrode on the first semiconductor region;
a second electrode on the back surface of the semiconductor substrate; and
a second semiconductor region positioned between the semiconductor substrate and the second electrode and doped with impurities of a second conductive type opposite the first conductive type, the second semiconductor region having a plurality of concave-convex portions,
wherein the second electrode is formed of a metal foil, and an air gap is formed between the second electrode formed of the metal foil and a back surface of the second semiconductor region,
wherein the second electrode formed of the metal foil includes:
a contact portion on the back surface of the second semiconductor region; and
a non-contact portion that is spaced apart from the back surface of the second semiconductor region to form the air gap between the second electrode and the back surface of the second semiconductor region,
wherein the contact portion of the second electrode has a protrusion that projects toward a concave portion of the plurality of concave-convex portions of the second semiconductor region and is connected to the second semiconductor region, and
wherein the non-contact portion of the second electrode is spaced apart from the second semiconductor region by the air gap.

2. The solar cell of claim 1, wherein the second semiconductor region contacts the contact portion of the second electrode, and
wherein an impurity doping concentration of a portion of the second semiconductor region contacting the contact portion of the second electrode is higher than an impurity doping concentration of a portion of the second semiconductor region not contacting the contact portion of the second electrode.

3. The solar cell of claim 1, further comprising a metal electrode layer positioned between the second semiconductor region and the second electrode formed of the metal foil, and the metal electrode layer being entirely connected to the semiconductor substrate and having a plurality of concave-convex portions,
wherein the contact portion of the second electrode contacts the metal electrode layer, and the non-contact portion of the second electrode is spaced apart from the metal electrode layer by the air gap.

4. The solar cell of claim 1, further comprising a back passivation layer positioned between the second semiconductor region and the second electrode formed of the metal foil, the back passivation layer being formed of a dielectric material and having a plurality of concave-convex portions,
wherein the contact portion of the second electrode passes through the back passivation layer and contacts the second semiconductor region, and
wherein the non-contact portion of the second electrode is spaced apart from the back passivation layer by the air gap.

5. The solar cell of claim 4, further comprising a conductive contact electrode passing through the back passivation layer and further positioned between the contact portion of the second electrode and the second semiconductor region.

6. The solar cell of claim 1, wherein the semiconductor substrate is formed of a crystalline silicon material,
wherein the second semiconductor region is formed of an amorphous silicon material,
wherein a transparent electrode layer is positioned at the back surface of the second semiconductor region formed of the amorphous silicon material and has a plurality of concave-convex portions,
wherein the contact portion of the second electrode contacts the transparent electrode layer, and
wherein the non-contact portion of the second electrode is spaced apart from the transparent electrode layer by the air gap.

7. The solar cell of claim 6, further comprising a conductive contact electrode positioned between the contact portion of the second electrode and the transparent electrode layer.

8. The solar cell of claim 1, wherein the metal foil of the second electrode directly includes a planar portion that corresponds to the plurality of concave-convex portions of the second semiconductor region.

* * * * *